United States Patent
Elston

(10) Patent No.: US 6,507,184 B1
(45) Date of Patent: Jan. 14, 2003

(54) METHODS AND APPARATUS FOR DIFFERENTIAL CURRENT MEASUREMENT IN A THREE-PHASE POWER SYSTEM

(75) Inventor: Joel A. B. Elston, Easton, PA (US)

(73) Assignee: ABB Automation Inc., Wickliffe, OH (US)

( * ) Notice: Subject to any disclaimer, the term of this patent is extended or adjusted under 35 U.S.C. 154(b) by 125 days.

(21) Appl. No.: 09/819,451

(22) Filed: Mar. 28, 2001

(51) Int. Cl.$^7$ ............................................. G01R 19/00
(52) U.S. Cl. ........................................ 324/107; 361/36
(58) Field of Search ................................ 324/107, 418, 324/424, 509, 521–522, 547, 552, 555, 618, 142; 361/36, 63, 93.5, 115

(56) References Cited

U.S. PATENT DOCUMENTS

| | | | |
|---|---|---|---|
| 4,704,653 A | 11/1987 | Li | 361/36 |
| 4,878,142 A | * 10/1989 | Bergman et al. | 324/509 |
| 5,784,233 A | 7/1998 | Bastard | 361/36 |
| 5,790,357 A | 8/1998 | Schiel | 361/36 |
| 5,854,590 A | * 12/1998 | Dalstein | 324/521 |

OTHER PUBLICATIONS

Elmore, W.A. (Ed.); "Protective Relaying Theory and Applications"; *ABB*, 1994, Chapter 2, p. 17–37. (No month).
Heining–Triebs, H.; "Testing of the Transformer Differential Relay"; *Siemens*, Mar. 8–10, 1994, p. i, 1–26.

* cited by examiner

Primary Examiner—Michael Sherry
Assistant Examiner—Minh N. Tang
(74) Attorney, Agent, or Firm—Woodcock Washburn LLP

(57) ABSTRACT

A measure of the current through a first terminal of a device in a three-phase power system is obtained for each phase of the system. A measure of the current through a second terminal is also obtained for each phase. To compensate for any changes in phase introduced by the device between the first and second terminals, the measured currents obtained for each phase at those terminals are normalized using a novel, generalized normalization transform having the form:

$$G(\theta) = \cos(\theta)U + \sin(\theta)J$$

where U represents a unit zero degree phase shift with zero sequence components removed, and J represents a unit ninety degree phase shift with zero sequence components removed. From the normalized currents, a differential current is then calculated for each phase.

29 Claims, 5 Drawing Sheets

| Phase Shift (degrees) | Transform |
|---|---|
| 0 | $\frac{1}{3}\begin{bmatrix} 2 & -1 & -1 \\ -1 & 2 & -1 \\ -1 & -1 & 2 \end{bmatrix}$ |
| 30 | $\frac{1}{\sqrt{3}}\begin{bmatrix} 1 & -1 & 0 \\ 0 & 1 & -1 \\ -1 & 0 & 1 \end{bmatrix}$ |
| 60 | $\frac{1}{3}\begin{bmatrix} 1 & -2 & 1 \\ 1 & 1 & -2 \\ -2 & 1 & 1 \end{bmatrix}$ |
| 90 | $\frac{1}{\sqrt{3}}\begin{bmatrix} 0 & -1 & 1 \\ 1 & 0 & -1 \\ -1 & 1 & 0 \end{bmatrix}$ |
| 120 | $\frac{1}{3}\begin{bmatrix} -1 & -1 & 2 \\ 2 & -1 & -1 \\ -1 & 2 & -1 \end{bmatrix}$ |
| 150 | $\frac{1}{\sqrt{3}}\begin{bmatrix} -1 & 0 & 1 \\ 1 & -1 & 0 \\ 0 & 1 & -1 \end{bmatrix}$ |
| 180 | $\frac{1}{3}\begin{bmatrix} -2 & 1 & 1 \\ 1 & -2 & 1 \\ 1 & 1 & -2 \end{bmatrix}$ |
| 210 | $\frac{1}{\sqrt{3}}\begin{bmatrix} -1 & 1 & 0 \\ 0 & -1 & 1 \\ 1 & 0 & -1 \end{bmatrix}$ |
| 240 | $\frac{1}{3}\begin{bmatrix} -1 & 2 & -1 \\ -1 & -1 & 2 \\ 2 & -1 & -1 \end{bmatrix}$ |
| 270 | $\frac{1}{\sqrt{3}}\begin{bmatrix} 0 & 1 & -1 \\ -1 & 0 & 1 \\ 1 & -1 & 0 \end{bmatrix}$ |
| 300 | $\frac{1}{3}\begin{bmatrix} 1 & 1 & -2 \\ -2 & 1 & 1 \\ 1 & -2 & 1 \end{bmatrix}$ |
| 330 | $\frac{1}{\sqrt{3}}\begin{bmatrix} 1 & 0 & -1 \\ -1 & 1 & 0 \\ 0 & -1 & 1 \end{bmatrix}$ |

FIG. 1A
(Prior Art)

METHODS AND APPARATUS FOR DIFFERENTIAL CURRENT MEASUREMENT IN A THREE-PHASE POWER SYSTEM

FIELD OF THE INVENTION

The present invention relates to power systems, and more particularly, to methods and apparatus for differential current measurement in three-phase power systems.

BACKGROUND

Differential current measurement is a technique used in a wide variety of power system applications. For example, the technique is often used in the protection of power system equipment, such as transformers, generators, motors, and the like. Generally, differential current measurement techniques involve monitoring the current at both an input terminal and an output terminal of a device, normalizing the measured input and output currents to compensate for changes in phase and magnitude of the measured currents that may be introduced by the device during normal operation, and then comparing the normalized input and output currents. If the difference between the normalized input and output currents is zero, then the device presumably is working properly. On the contrary, a detected difference between the normalized input and output currents may indicate a fault within the device. In response to the detection of a fault, a relay or other circuit breaker may be triggered to shut off power to the device in order to prevent further damage.

FIG. 1 is an example of how differential current measurement may be employed in the protection of a three-phase power distribution transformer 10. As shown, each phase a, b, and c of the power system is connected to a respective primary winding (high-voltage side) of the transformer 10 via a respective input of a first terminal 12. Similarly, a second terminal 14 provides an output from the secondary winding for each phase (low-voltage side). Current transformers 16a, 16b, and 16c can be used to obtain a measure of the current flowing into each phase of the first terminal ($I_{1a}$, $I_{1b}$, and $I_{1c}$). Similarly, a measure of the current flowing out of each phase of the second terminal ($I_{2a}$, $I_{2b}$, and $I_{2c}$) can be obtained by respective current transformers 18a, 18b, and 18c.

Transformers like that shown in FIG. 1 are often employed either to step-up or step-down an input voltage or current. This naturally introduces a change in the magnitude of the voltage or currents entering and leaving the device. With a transformer, the magnitude of this change is dependent upon the ratio of the number of turns, $N_1$, in the primary winding of the transformer to the number of turns, $N_2$, in the secondary winding. Specifically, the input current ($I_1$) to the primary winding will be equal to $N_2/N_1$ times the current output from the secondary winding ($I_2$). Thus, $I_1 = N_2/N_1(I_2)$. The turns ratio of the transformer must be taken into account when normalizing the input and output currents during the differential current measurement process.

The magnitude and phase of the input currents can also be affected during normal operation of a transformer by the manner in which the primary windings (high-voltage side) for each phase and the secondary windings (low-voltage side) for each phase are connected, or wired. Two common ways to wire the multi-phase windings on one side of a transformer are referred to in the art as the Wye (Y) configuration and the Delta (Δ) configuration. Different combinations of these and other configurations can be used to wire the respective primary and secondary windings. In the example of FIG. 1, the primary windings of the transformer are connected in a Wye (Y) configuration, and the secondary windings are connected in a delta (Δ) configuration. A Y-Δ wiring configuration of this type will introduce a phase shift of 30 degrees, and a change in magnitude between the input and output currents by a factor of $1/\sqrt{3}$. That is, ignoring the turns ratio, $I_1 = 1/\sqrt{3} \angle +30° (I_2)$, where $I_1$ is the input current to the primary winding and $I_2$ is the output current from the secondary winding. Other wiring configurations will result in other phase shift magnitudes. Generally, the known wiring configurations for distribution transformers in use in the power distribution industry induce phase shifts that are some multiple of 30°. Different phase shifts result in different changes in current magnitude. These changes in magnitude and phase must also be taken into account when normalizing the input and output currents during the differential current measurement process.

With respect to the phase and magnitude changes caused by the wiring configuration at the primary and secondary windings, one way to cancel out those changes to achieve normalization is to wire the current transformers 16a–c, 18a–c in such a way as to cancel out the affect of the transformer wiring configuration. Generally, however, power distribution system customers do not favor such a solution, particularly because the variety of different wiring configurations for the primary and secondary transformer windings requires a different current transformer wiring configuration to provide the appropriate normalization in each case. Consequently, this form of physical normalization, commonly referred to as current transformer phasing, makes transformer installation much more difficult and costly.

Because of the difficulties with current transformer phasing, the general approach to normalization with respect to magnitude and phase changes caused by the wiring configurations of transformers today is to digitize the measured currents obtained with the current transformers 16a–c, 18a–c, and to then perform the normalization functions digitally on a programmable processor or microcontroller. In this manner, different transformer wiring configurations can be accommodated by simply reprogramming the processor for each different case, while using the same physical connection for the current transformers. Transformer installation is thus simplified and less costly.

FIG. 1 illustrates this form of digital processing. As shown, the current measurements obtained by the respective sets of input and output current transformers 16a–c, 18a–c, are digitized and passed through respective normalization functions 20, 22 to produce normalized input ($\overline{I_{1a}}$, $\overline{I_{1b}}$, and $\overline{I_{1c}}$) and output ($\overline{I_{2a}}$, $\overline{I_{2b}}$, and $\overline{I_{2c}}$) currents in which changes in magnitude and phase introduced by the transformer 10 during normal operation are factored out. A differential current function 24 then calculates a differential current for each phase from the normalized input and output currents ($I_{OPa} = \overline{I_{1a}} - \overline{I_{2a}}$; $I_{OPb} = \overline{I_{1b}} - \overline{I_{2b}}$; and $I_{OPc=+e,ovs\ 1c} + ee - \overline{I_{2c}}$). During normal operation of the transformer 10, each $I_{OP}$ current should equal zero. However, a fault within the transformer 10 should result in a non-zero reading. The non-zero reading can be used as an indication of a transformer fault. Upon detecting such a non-zero reading, a relay or circuit breaker can be triggered to interrupt power to the transformer to prevent further damage.

Another consideration to be taken into account in performing differential current measurements in a multi-phase power system, particularly in differential current measurements used for protection of transformers, is the presence of a zero-sequence current component. Power system connections that allow ground or zero sequence current to flow will add to the individual phase currents, and where it is present on only one side of the device will create a non-zero combination that will result in a false differential current reading that could be interpreted as a fault within the device (i.e., "internal fault") when in actuality the fault has occurred in the line outside of the device (i.e., "external fault" or "through fault"). Because of this possibility, in addition to compensating for the phase shifts introduced by the device, it is also necessary for the normalization technique to eliminate the zero-sequence current component when calculating the appropriate normalization factor.

For three-phase power systems, the normalization calculations, including the removal of the zero-sequence current component, can be reduced to a 3×3 matrix transform. Indeed, the power transformer industry has developed a series of such matrix transforms to perform normalization and zero-sequence current component removal for the different multiples of 30° phase shifts that result from the various wiring configurations commonly in use in the industry. For example, the normalization required on the currents measured from the secondary winding (low-voltage side) of the transformer 10 in the example of FIG. 1 (where the phase shift is 30°), with the removal of the zero-sequence component, can be achieved with the following matrix transform calculation:

$$\begin{bmatrix} \overline{I_{2a}} \\ \overline{I_{2b}} \\ \overline{I_{2c}} \end{bmatrix} = \frac{1}{\sqrt{3}} \begin{bmatrix} 1 & -1 & 0 \\ 0 & 1 & -1 \\ -1 & 0 & 1 \end{bmatrix} \begin{bmatrix} I_{2a} \\ I_{2b} \\ I_{2c} \end{bmatrix}$$

where $\overline{I_{2a}}$, $\overline{I_{2b}}$, and $\overline{I_{2c}}$ are the normalized current values (ignoring the turns ratio) for the measured currents $I_{2a}$, $I_{2b}$, and $I_{2c}$ obtained from the current transformers 18a, 18b, and 18c, respectively. Similarly, elimination of the zero-sequence component from the current measurements obtained on the high-voltage side can be obtained using the following matrix transform for a 0° phase reference:

$$\begin{bmatrix} \overline{I_{1a}} \\ \overline{I_{1b}} \\ \overline{I_{1c}} \end{bmatrix} = \frac{1}{3} \begin{bmatrix} 2 & -1 & -1 \\ -1 & 2 & -1 \\ -1 & -1 & 2 \end{bmatrix} \begin{bmatrix} I_{1a} \\ I_{1b} \\ I_{1c} \end{bmatrix}$$

where $\overline{I_{1a}}$, $\overline{I_{1b}}$, and $\overline{I_{1c}}$ are the normalized current values (ignoring the turns ratio) for the measured currents $I_{1a}$, $I_{1b}$, and $I_{1c}$ obtained from the current transformers 18a, 18b, and 18c, respectively.

FIG. 1A is a table providing the standard matrix transforms for the different multiples of 30° phase shifts that the various industry standard transformer wiring configurations may introduce. During set-up of a transformer protection device that performs differential current measurements using such matrix calculations, the technician will select the appropriate transforms (high-voltage side and low-voltage side) from the table of FIG. 1A and program the protection device to perform normalization of the measured input and output currents in accordance with the selected transforms. Typically, the 0° transform will be used as the reference transform on the high-voltage side of the transformer, as in the example above.

While the use of digital processing and the standard matrix transforms listed in the table of FIG. 1 A has simplified the installation of power system equipment that relies upon differential current measurement techniques, there are still disadvantages and drawbacks to the use of these matrix transforms. First, a technician is still required to select the appropriate transforms from the table based on the physical connections of the equipment and to then program the equipment to perform those transforms. Second, while these transforms work for ideal phase shifts that are multiples of 30°, they cannot compensate for non-ideal device physics that might cause slight variations in the expected theoretical phase shift. Third, these transforms obviously do not enable a device to perform dynamic phase shift compensation; rather, a single transform is selected by a technician based on the device connections and that transform is then used exclusively. Because of these drawbacks, there is a need for a differential current measurement technique that performs the appropriate normalization, including removal of the zero-sequence component, for any phase shift (thus being capable of handling non-ideal device physics), and that can perform such normalization dynamically. The present invention satisfies this need.

SUMMARY

The present invention is directed to a method and apparatus for measuring the differential current between a first terminal and a second terminal of a device in a three-phase power system, where the device introduces a difference in phase between the current through the first terminal and the current through the second terminal. The method and apparatus of the present invention can be used in a wide variety of power system applications in which differential current measurements are needed, such as, for example, in the protection of power system equipment, such as transformers, generators, motors, and the like. According to the present invention, a measure of the current through the first terminal is obtained for each phase of the three-phase power system, and a measure of the current through the second terminal is obtained for each phase. The measured currents obtained for each phase at the first and second terminals are then normalized to compensate for any changes in phase introduced by the device. The normalization is performed using a novel, generalized transform having the form:

$$G(\theta) = \cos(\theta)U + \sin(\theta)J$$

where U represents a unit zero degree phase shift with zero sequence components removed, and J represents a unit ninety degree phase shift with zero sequence components removed. The normalized currents are then used to calculate a differential current measurement for each phase.

The generalized transform $G(\theta)$ properly normalizes the measured currents for any phase angle difference between them; that is, the generalized transform $G(\theta)$ works for all $\theta$ from 0 to $2\pi$. Moreover, because the generalized transform works for any phase shift, it provides correct normalization even in the presence of non-ideal device physics. Furthermore, because the generalized transform works for any phase shift, the generalized transform can be used in conjunction with a phase measurement device to provide dynamic normalization as the phase shift between the input and output currents of a device varies over time.

Other features and advantages of the present invention will become evident hereinafter.

BRIEF DESCRIPTION OF THE DRAWINGS

The foregoing summary, as well as the following detailed description of the invention, is better understood when read in conjunction with the appended drawings. For the purpose of illustrating the invention, various embodiments are shown in the drawings, it being understood, however, that the invention is not limited to the specific methods and instrumentalities disclosed. In the drawings:

FIG. 1A is a table providing a list of prior art matrix transforms for the different multiples of 30° phase shifts that the various industry standard transformer wiring configurations may introduce;

DETAILED DESCRIPTION OF THE INVENTION

The present invention is directed to a method and apparatus for measuring the differential current between a first terminal and a second terminal of a device in a three-phase power system, where the device introduces a difference in phase between the current through the first terminal and the current through the second terminal. The method and apparatus of the present invention can be used in a wide variety of power system applications in which differential current measurements are needed, such as, for example, in the protection of power system equipment, such as transformers, generators, motors, and the like. In one particular embodiment, the method and apparatus of the present invention are employed in a transformer protection unit that utilizes the resulting differential current measurement as an indicator of faults within the transformer.

Figure 2:
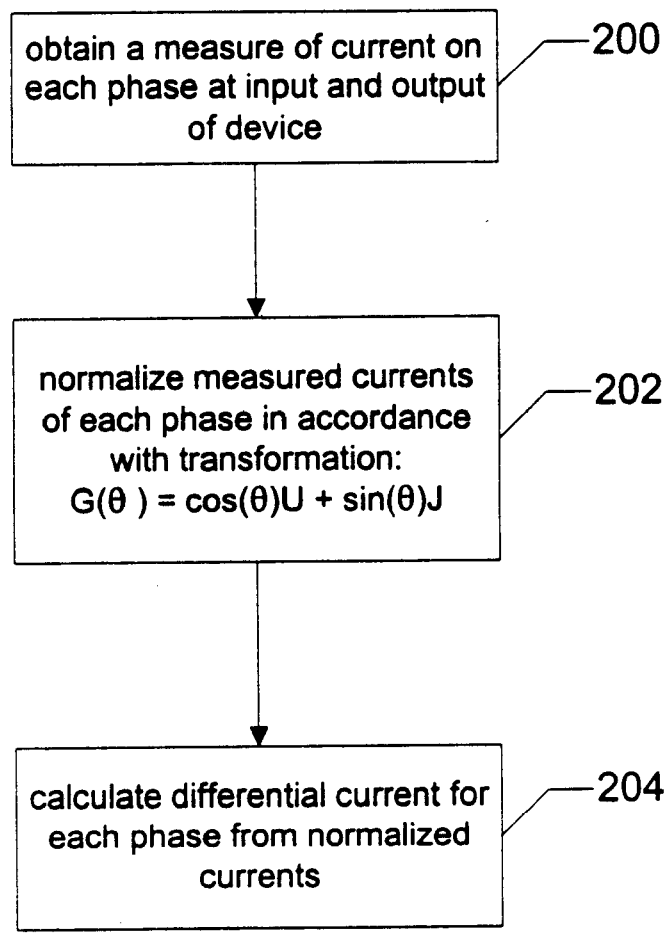
FIG. 2 is a flow diagram illustrating a method of obtaining a differential current measurement in accordance with an embodiment of the present invention.

FIG. 2 is a flow diagram illustrating an embodiment of the method of the present invention. At step 200, a measure of the current through the first terminal of a device is obtained for each phase of a three-phase power system, and a measure of the current through a second terminal is also obtained for each phase. At step 210, in order to compensate for changes in phase (and possibly also magnitude) introduced by the device, the measured currents obtained for each phase at the first and second terminals are normalized. In accordance with the present invention, the normalization is performed using a novel generalized normalization transform having the form:

$$G(\theta) = \cos(\theta)U + \sin(\theta)J$$

where U represents a unit zero degree phase shift with zero sequence components removed, and J represents a unit ninety degree phase shift with zero sequence components removed. The transform, G( ), thus comprises a quadrature combination of U and J.

In greater detail, if $I_1$ represents the measured currents of each phase through the first terminal of the device and $I_2$ represents the measured currents of each phase through the second terminal of the device, then the normalization of these currents is achieved by the following calculations:

$$\overline{I}_1 = G(0)\ I_1 = \cos(0)U\ I_1 + \sin(0)J\ I_1,\ \text{and}$$

$$\overline{I}_2 G(P)\ I_2 = \cos(P)U\ I_2 + \sin(P)J\ I_2$$

where P represents the phase angle by which the phase of $I_1$ lags the phase of $I_2$, and $\overline{I}_1$ and $\overline{I}_2$ represent the normalized measured currents of $I_1$ and $I_2$, respectively. An angle of zero degrees is used as the reference with respect to the calculation of the normalized currents ($\overline{I}_1$) through the first terminal.

In greater detail, in a three phase power system, $$U = \frac{1}{3}\begin{bmatrix} 2 & -1 & -1 \\ -1 & 2 & -1 \\ -1 & -1 & 2 \end{bmatrix},\ \text{and}\ J = \frac{1}{\sqrt{3}}\begin{bmatrix} 0 & -1 & 1 \\ 1 & 0 & -1 \\ -1 & 1 & 0 \end{bmatrix}$$

The generalized transform thus has the form:

$$G(\theta) = \cos(\theta)\frac{1}{3}\begin{bmatrix} 2 & -1 & -1 \\ -1 & 2 & -1 \\ -1 & -1 & 2 \end{bmatrix} + \sin(\theta)\frac{1}{\sqrt{3}}\begin{bmatrix} 0 & -1 & 1 \\ 1 & 0 & -1 \\ -1 & 1 & 0 \end{bmatrix}$$

Thus, normalization is achieved using the following matrix calculations:

$$\begin{bmatrix} \overline{I}_{1a} \\ \overline{I}_{1b} \\ \overline{I}_{1c} \end{bmatrix} =$$

$$\cos(0)\frac{1}{3}\begin{bmatrix} 2 & -1 & -1 \\ -1 & 2 & -1 \\ -1 & -1 & 2 \end{bmatrix}\begin{bmatrix} I_{1a} \\ I_{1b} \\ I_{1c} \end{bmatrix} + \sin(0)\frac{1}{\sqrt{3}}\begin{bmatrix} 0 & -1 & 1 \\ 1 & 0 & -1 \\ -1 & 1 & 0 \end{bmatrix}\begin{bmatrix} I_{1a} \\ I_{1b} \\ I_{1c} \end{bmatrix}$$

and $$\begin{bmatrix} \overline{I}_{2a} \\ \overline{I}_{2b} \\ \overline{I}_{2c} \end{bmatrix} =$$

$$\cos(P)\frac{1}{3}\begin{bmatrix} 2 & -1 & -1 \\ -1 & 2 & -1 \\ -1 & -1 & 2 \end{bmatrix}\begin{bmatrix} I_{2a} \\ I_{2b} \\ I_{2c} \end{bmatrix} + \sin(P)\frac{1}{\sqrt{3}}\begin{bmatrix} 0 & -1 & 1 \\ 1 & 0 & -1 \\ -1 & 1 & 0 \end{bmatrix}\begin{bmatrix} I_{2a} \\ I_{2b} \\ I_{2c} \end{bmatrix}$$

where $I_{1a}$, $I_{1b}$, and $I_{1c}$ are the measured currents through the first terminal for each of the phases designated a, b, and c, respectively; $I_{2a}$, $I_{2b}$, and $I_{2c}$ are the measured currents through the second terminal for each phase; P is the phase angle by which the phase of the currents through the first terminal lag the phase of currents through the second terminal; and $\overline{I}_{1a}$, $\overline{I}_{1b}$, $\overline{I}_{1c}$, and $\overline{I}_{2a}$, $\overline{I}_{2b}$, $\overline{I}_{2c}$ represent the respective normalized current measurements.

It has been discovered that the generalized transform G(θ) of the present invention has several advantageous properties. First, the generalized transform properly normalizes the measured currents, $I_1$ and $I_2$, for any phase angle difference between them; that is, the generalized transform G(θ) works for all θ from 0 to 2π. Unlike in the prior art, where a different transform must be programmed to handle each of the different multiples of 30° phase shifts that commonly occur in the power industry, the generalized transform G(θ) can be programmed once to handle any such phase shift, irrespective of the particular manner in which the device under test is connected to the three-phase power system. Second, because the generalized transform works for any phase shift, not just multiples of 30°, it provides correct normalization even in the presence of non-ideal device physics. Third, because the generalized transform works for any phase shift, the generalized transform can be used in conjunction with a phase measurement device to provide dynamic normalization as the phase shift between the input and output currents of a device varies over time. Thus, for example, steps 202 and 204 of FIG. 2 can be continuously repeated as the phase angle between the input and output currents is continuously measured. Alternatively, steps 202 and 204 of FIG. 2 can be repeated periodically at some fixed or varying interval. Such a capability has not heretofore been possible.

Figure 3:
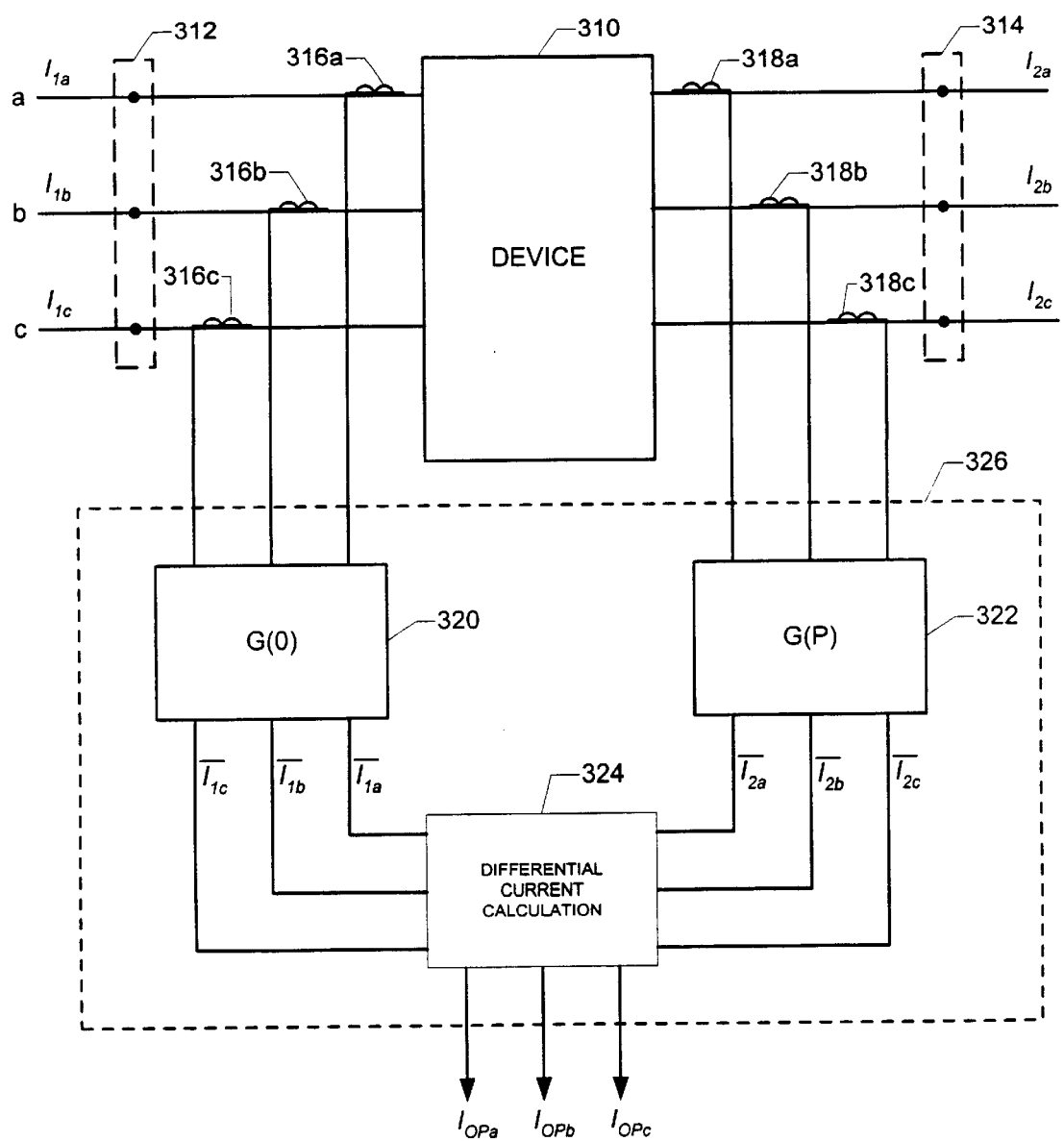
FIG. 3 is a block diagram illustrating apparatus for obtaining a differential current measurement in accordance with an embodiment of the present invention.

FIG. 3 is a block diagram illustrating one embodiment of apparatus for obtaining a differential current measurement between the first and second terminals 312, 314 of a device 310 in a three-phase power system, in accordance with the present invention. The different phases are designated a, b, and c, respectively.

According to the present invention, the apparatus of the present invention comprises a first sensor coupled to the first terminal 312 to obtain, for each phase, a measure of the current through the first terminal. In the embodiment shown, the first sensor comprises a plurality of current transformers (in this case three) 316a, 316b, and 316c, respectively. Similarly, a second sensor is coupled to the second terminal to obtain, for each phase, a measure of the current through the second terminal. Again, in the embodiment shown, the second sensor comprises a second plurality of current transformers 318a, 318b, and 318c, respectively. Each current transformer generates an output current signal representative of the current I through its respective phase of one of the terminals 312, 314. As shown, the current signals from each current transformer 316a–c, 318a–c are fed to a processor 326.

While in the embodiment shown, the current sensors are implemented using a respective plurality of current transformers, in other embodiments, the current sensors may take other forms. For example, magneto-optic current transducers can be employed in place of the current transformers. Indeed, any sensor or device capable of producing a representation of the current through a terminal or wire may be employed.

Preferably, the current signal output from each of the current transformers 316a–c, 318a–c is converted from an analog signal to a digital signal using a respective plurality of analog-to-digital converters (not shown). These converters may comprise discrete components or may be part of the processor 326.

As further shown, the processor 326 receives the measures of current obtained by the current transformers 316a–c, 318a–c and then applies the general transform $G(\theta)$ of the present invention to normalize the measured currents in order to compensate for changes in phase introduced by the device, in the manner described above. Specifically, as illustrated at block 320, the measures of current signals $I_{1a}$, $I_{1b}$, and $I_{1c}$, obtained at the first terminal 312 of the device are applied to the generalized transform using a phase angle of 0° as a reference angle. As illustrated at block 322, the measures of current signals $I_{2a}$, $I_{2b}$, and $I_{2c}$ obtained at the second terminal 314 are applied to the generalized transform using the phase angle, P, which represents the phase angle by which the phase of the currents at the first terminal lags the phase of the currents at the second terminal. P can be a predetermined value that is determined by a technician and programmed into the processor 326 based on the physical connections of the device to the three-phase power system, or as described more fully below, P may be determined from a measuring device to allow continuous or periodic recalculation of the normalized currents.

The normalized currents $\overline{I_{1a}}, \overline{I_{1b}}, \overline{I_{1c}}$ and $\overline{I_{2a}}, \overline{I_{2b}}, \overline{I_{2c}}$ are then applied to a differential current calculation function 324, as shown, to produce a differential current signal for each phase $-I_{OPa}, I_{OPb},$ and $I_{OPc}$, respectively.

The processor 326 may comprise a plurality of discrete components or hard-wired logic that implements each of the functions 320, 322, and 324, or alternatively, the processor 326 may comprise a microprocessor, microcontroller, digital signal processor or any other general or special purpose processor that executes program code to perform the functions 320, 322, and 324. Thus, in this regard, the present invention may take the form of program code (i.e., instructions) stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. The present invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 4:
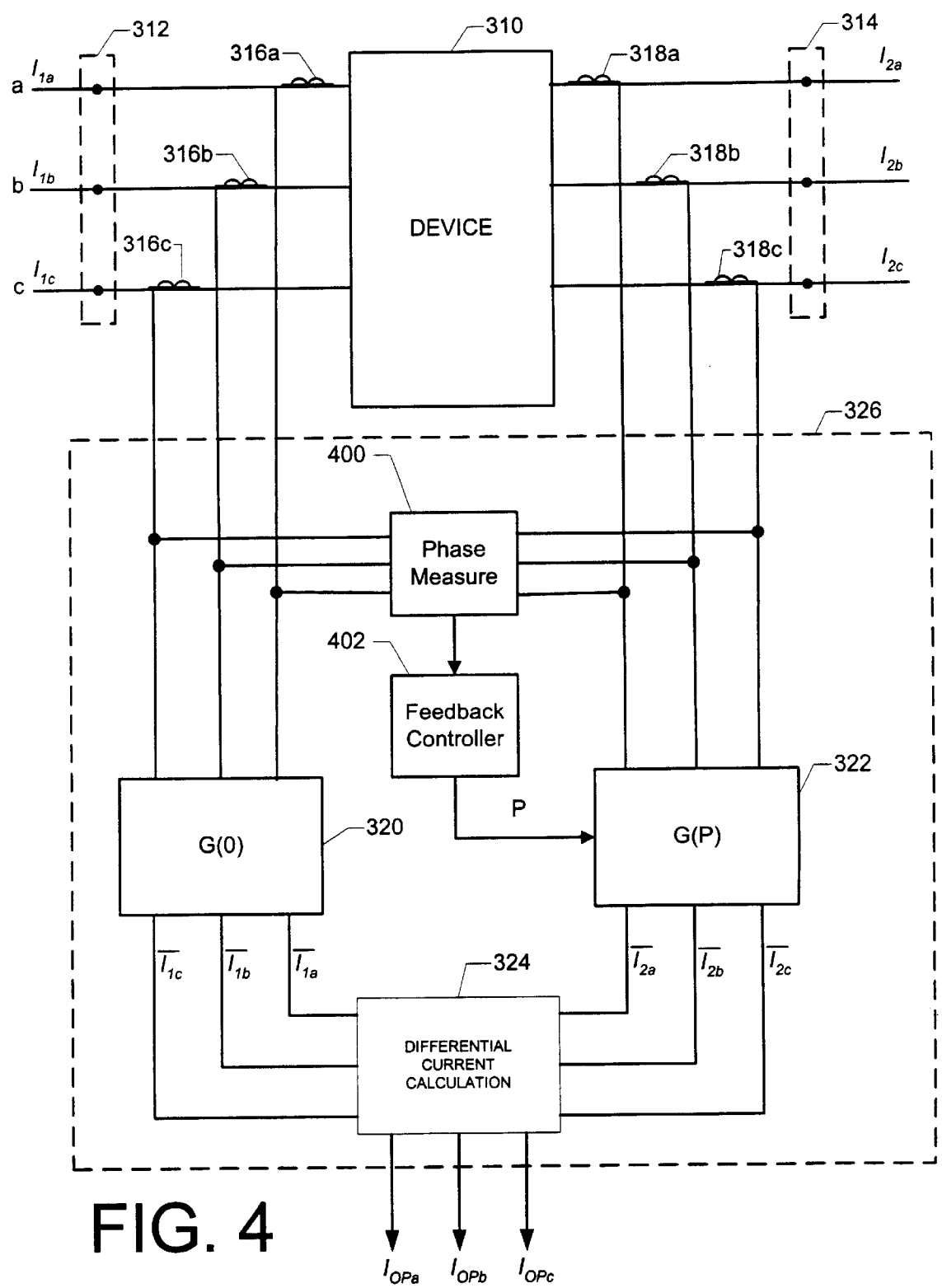
FIG. 4 is a block diagram illustrating another embodiment of apparatus for obtaining a differential current measurement in accordance with the present invention.

FIG. 4 is a block diagram illustrating another embodiment of apparatus for obtaining a differential current measurement in accordance with the present invention. In this embodiment, a phase measurement device 400 is coupled to receive the measured currents at both the first terminal and second terminal for at least one phase, and to generate therefrom a measure of the phase angle difference by which the phase of the current at the first terminal lags the phase of the current at the second terminal. Such phase angle computations are routine in the power industry, particularly, for example, in the field of protective relaying, and further description of the phase measurement device 400 is not necessary. Preferably, the device 400 produces a signal representing a continuous measurement of the phase angle.

In the present embodiment, the phase angle measurement signal from the device 400 is input to a feedback controller 402 that conditions the phase measurement to produce either (i) nearly continuous, (ii) periodic, or (iii) stationary phase values. The value(s) output from the feedback controller 402 is (are) then input to the generalized transform function 322 to be used in the normalization calculation. By providing near continuous or periodic phase measurement values from the feedback controller, dynamic recalculation of the normalized currents can be performed as the phase angle between the currents at the first and second terminals varies over time. Recalculation can occur nearly continuously or at periodic or varying intervals, as desired.

Figure 1:
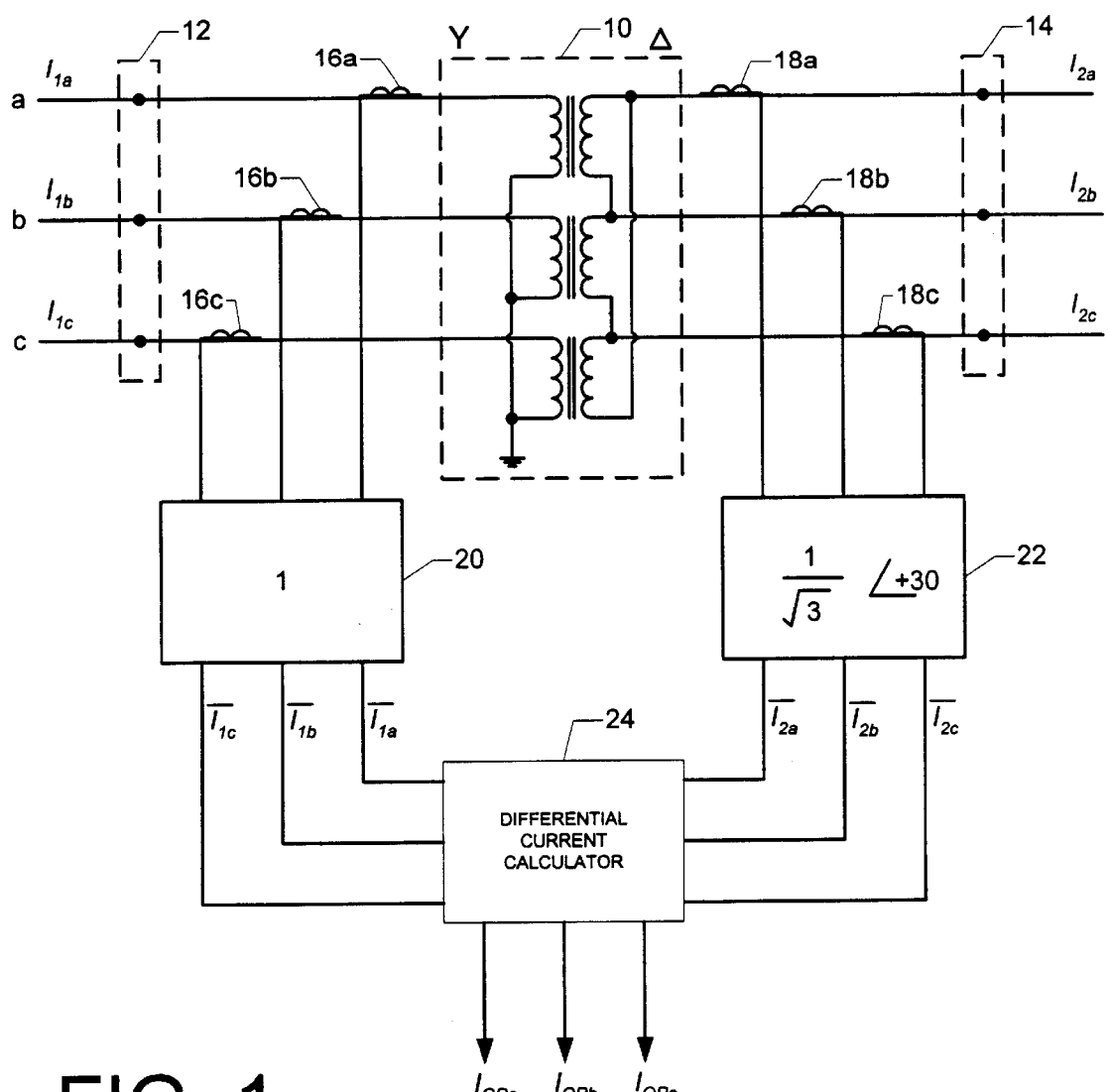
FIG. 1 illustrates a conventional differential current measurement technique in the context of a three-phase power distribution transformer.

As mentioned above, the method and apparatus of the present invention can be used in a wide variety of power system applications in which differential current measurements are needed, such as, for example, in the protection of power system equipment, such as transformers, generators, motors, and the like. In one particular embodiment, the method and apparatus of the present invention are embodied in a transformer protection unit (not shown) that utilizes the resulting differential current measurement as an indicator of faults within the transformer. For example, in FIGS. 3 and 4, the device 310 may be a transformer, such as the three-phase power transformer 10 of FIG. 1, and the components 316a–c, 318a–c, 320, 322, 324, 326, 400, and 402 may collectively be part of a transformer protection unit that is coupled to the transformer to monitor and detect potential fault conditions within the transformer, based on the differential current measurements obtained using the present invention.

As the foregoing illustrates, the present invention is directed to a method and apparatus for measuring the differential current between a first terminal and a second terminal of a device in a three-phase power system using the generalized transform $G(\theta)$ described above. It is understood that changes may be made to the embodiments described above without departing from the broad inventive concepts thereof. Accordingly, the present invention is not limited to the particular embodiments disclosed, but is intended to cover all modifications that are within the spirit and scope of the invention as defined by the appended claims.

What is claimed is:

1. A method for measuring the differential current between a first terminal of a device in a three-phase power system and a second terminal of the device, wherein the device introduces a phase shift between said first and second terminals on each phase of the power system, the method comprising:

obtaining, for each phase, a measure of the current through the first terminal of the device and a measure of the current through the second terminal of the device;

normalizing the measured currents of each phase of the first and second terminals in order to compensate for changes in at least one of phase and magnitude introduced by the device, said normalization being performed in accordance with the following transformation:

$$G(\theta) = \cos(\theta) U + \sin(\theta) J$$

where $G(\ )$ is a generalized normalization transform comprising a quadrature combination of U and J, U represents a unit zero degree phase shift with zero sequence components removed, and J represents a unit ninety degree phase shift with zero sequence components removed; and calculating from the normalized measured currents a differential current for each phase.

2. The method recited in claim 1, wherein said normalization of the measured currents at the first terminal ($I_1$) and at the second terminal ($I_2$) is performed by calculating the following:

$$\bar{I}_1 = G(0) \ I_1 = \cos(0) U \ I_1 + \sin(0) J \ I_1, \text{ and}$$

$$\bar{I}_2 G(P) \ I_2 = \cos(P) U \ I_2 + \sin(P) J \ I_2$$

where P represents the phase angle by which the phase of $I_1$ lags the phase of $I_2$, and $\bar{I}_1$ and $\bar{I}_2$ represent the normalized measured currents of $I_1$ and $I_2$, respectively.

3. The method recited in claim 1, wherein $$I_1 = \begin{bmatrix} I_{1a} \\ I_{1b} \\ I_{1c} \end{bmatrix}, I_2 = \begin{bmatrix} I_{2a} \\ I_{2b} \\ I_{2c} \end{bmatrix}, U =$$

$$\frac{1}{3}\begin{bmatrix} 2 & -1 & -1 \\ -1 & 2 & -1 \\ -1 & -1 & 2 \end{bmatrix}, \text{ and } J = \frac{1}{\sqrt{3}}\begin{bmatrix} 0 & -1 & 1 \\ 1 & 0 & -1 \\ -1 & 1 & 0 \end{bmatrix},$$

where $I_{1a}$, $I_{1b}$, and $I_{1c}$ are the measured currents through the first terminal and $I_{2a}$, $I_{2b}$, and $I_{2c}$ are the measured currents through the second terminal, for each of the three phases designated a, b, and c, respectively.

4. The method recited in claim 2, further comprising:

continuously measuring the phase angle, P, between the first and second terminals; and dynamically recalculating the normalized measured currents $\bar{I}_1$ and $\bar{I}_2$ based on the measured phase angle.

5. The method recited in claim 2, further comprising:

periodically measuring the phase angle, P, between the first and second terminals; and recalculating the normalized measured currents $\bar{I}_1$ and $\bar{I}_2$ based on the periodically measured phase shift.

6. A method for measuring the differential current between a first terminal of a device in a three-phase power system and a, second terminal of the device, wherein the device introduces a phase shift between said first and second terminals on each phase of the power system, the method comprising:

obtaining, for each phase, a measure of the current ($I_1$) through the first terminal of the device;

obtaining, for each phase, a measure of the current ($I_2$) through the second terminal of the device;

normalizing the measured currents of each phase of the first and second terminals in accordance with the following transformations:

$$\bar{I}_1 G(0) \ I_1 = \cos(0) U \ I_1 + \sin(0) J \ I_1, \text{ and}$$

$$\bar{I}_2 = G(P) \ I_2 = \cos(P) U \ I_2 + \sin(P) J \ I_2$$

where $G(\ )$ is a generalized normalization transform comprising a quadrature combination of U and J, P represents the phase angle by which the phase of $I_1$ lags the phase of $I_2$, U represents a unit zero degree phase shift with zero sequence components removed, J represents a unit ninety degree phase shift with zero sequence components removed, and $\bar{I}_1$ and $\bar{I}_2$ represent the normalized measured currents of $I_1$ and $I_2$ respectively; and calculating from the normalized measured currents a differential current for each phase.

7. The method recited in claim 6, wherein $$I_1 = \begin{bmatrix} I_{1a} \\ I_{1b} \\ I_{1c} \end{bmatrix}, I_2 = \begin{bmatrix} I_{2a} \\ I_{2b} \\ I_{2c} \end{bmatrix}, U =$$

$$\frac{1}{3}\begin{bmatrix} 2 & -1 & -1 \\ -1 & 2 & -1 \\ -1 & -1 & 2 \end{bmatrix}, \text{ and } J = \frac{1}{\sqrt{3}}\begin{bmatrix} 0 & -1 & 1 \\ 1 & 0 & -1 \\ -1 & 1 & 0 \end{bmatrix},$$

where $I_{1a}$, $I_{1b}$, and $I_{1c}$ are the measured currents through the first terminal and $I_{2a}$, $I_{2b}$, and $I_{2c}$ are the measured currents through the second terminal for each of the three phases designated a, b, and c, respectively.

8. The method recited in claim 6, further comprising:

continuously measuring the phase angle, P, between the first and second terminals; and dynamically recalculating the normalized measured currents $\bar{I}_1$ and $\bar{I}_2$ based on the measured phase shift.

9. The method recited in claim 6, further comprising:

periodically measuring the phase angle, P, between the first and second terminals; and recalculating the normalized measured currents $\bar{I}_1$ and $\bar{I}_2$ based on the periodically measured phase shift.

10. Apparatus for measuring the differential current between a first terminal of a device in a three-phase power system and a second terminal of the device, wherein the device introduces a phase shift between said first and second terminals on each phase of the power system, the apparatus comprising:

a first sensor coupled to the first terminal and obtaining, for each phase, a measure of the current through the first terminal;

a second sensor coupled to the second terminal and obtaining, for each phase, a measure of the current through the second terminal; and a processor connected to receive the measures of current obtained by the first and second sensors and to normalize the measured currents in order to compensate for changes in at least one of phase and magnitude introduced by the device, said processor performing such normalization in accordance with the following transformation:

$$G(\theta)=\cos(\theta)U+\sin(\theta)J$$

where G( ) is a generalized normalization transform comprising a quadrature combination of U and J, U represents a unit zero degree phase shift with zero sequence components removed, and J represents a unit ninety degree phase shift with zero sequence components removed, said processor further calculating from the normalized measured currents a differential current for each phase.

11. The apparatus recited in claim 10, wherein $I_1$ represents the measured currents obtained at the first terminal by the first sensor and $I_2$ represents the measured currents obtained at the second terminal by the second sensor, and wherein the processor calculates the following:

$$\bar{I}_1=G(0)\ I_1=\cos(0)U\ I_2+\sin(0)J\ I_1, \text{ and}$$

$$\bar{I}_2=G(P)\ I_2=\cos(P)U\ I_2+\sin(P)J\ I_2$$

where P represents the phase angle by which the phase of $I_1$ lags the phase of $I_2$, and $\bar{I}_1$ and $\bar{I}_2$ represent the normalized measured currents of $I_1$ and $I_2$, respectively.

12. The apparatus recited in claim 1, wherein $$I_1 = \begin{bmatrix} I_{1a} \\ I_{1b} \\ I_{1c} \end{bmatrix}, I_2 = \begin{bmatrix} I_{2a} \\ I_{2b} \\ I_{2c} \end{bmatrix}, U = \frac{1}{3}\begin{bmatrix} 2 & -1 & -1 \\ -1 & 2 & -1 \\ -1 & -1 & 2 \end{bmatrix}, \text{ and } J = \frac{1}{\sqrt{3}}\begin{bmatrix} 0 & -1 & 1 \\ 1 & 0 & -1 \\ -1 & 1 & 0 \end{bmatrix},$$

where $I_{1a}$, $I_{1b}$, and $I_{1c}$ are the measured currents through the first terminal and $I_{2a}$, $I_{2b}$, and $I_{2c}$ are the measured currents through the second terminal, for each of the three phases designated a, b, and c, respectively.

13. The apparatus recited in claim 12, wherein the first sensor comprises a plurality of current transformers, one connected to each of the three phase inputs of the first terminal, and the second sensor comprises a plurality of current transformers, one connected to each of the three phase outputs of the second terminal.

14. The apparatus recited in claim 13, further comprising a plurality of analog-to-digital converters for digitalizing the measures of current obtained by the respective plurality of current transformers prior to being input to the processor.

15. The apparatus recited in claim 11, farther comprising a phase angle measurement device connected to the first terminal and to the second terminal that obtains a measure of the phase angle, P, between the currents at the first and second terminals, the processor calculating the normalized measured currents $\bar{I}_1$ and $\bar{I}_2$ based on the measured phase angle, P.

16. The apparatus recited in claim 15, wherein the phase angle measurement device continuously measures the phase angle P, and wherein the processor continuously recalculates the normalized measured currents $\bar{I}_1$ and $\bar{I}_2$ based on the measured phase shift P.

17. The apparatus recited in claim 10, wherein the device comprises a transformer.

18. A transformer protection unit for detecting faults in a power transformer of a three-phase power system, the transformer having a plurality of primary windings and a plurality of secondary windings, one of each for each of the different phases of the power system, the transformer protection unit comprising:

a first plurality of current sensors, each coupled to a respective one of the primary windings of the transformer for obtaining a measure of the current through that winding;

a second plurality of current sensors, each coupled to a respective one of the secondary windings of the transformer for obtaining a measure of the current through that winding; and a processor connected to receive the measures of current obtained by the first and second pluralities of current sensors and to normalize the measured currents in order to compensate for changes in at least one of phase and magnitude introduced by the transformer, said processor performing such normalization in accordance with the following transformation:

$$G(\theta)=\cos(\theta)U+\sin(\theta)J$$

where G( ) is a generalized normalization transform comprising a quadrature combination of U and J, U represents a unit zero degree phase shift with zero sequence components removed, and J represents a unit ninety degree phase shift with zero sequence components removed, said processor further calculating from the normalized measured currents a differential current for each phase.

19. The transformer protection unit recited in claim 18, wherein $I_1$ represents the measured currents obtained by the first plurality of current sensors and $I_2$ represents the measured currents obtained by the second plurality of current sensors, and wherein the processor calculates the following:

$$\bar{I}_1=G(0)\ I_1=\cos(0)U\ I_1+\sin(0)J\ I_1, \text{ and}$$

$$\bar{I}_2=G(P)\ I_2=\cos(P)U\ I_2+\sin(P)J\ I_2$$

where P represents the phase angle by which the phase of $I_1$ lags the phase of $I_{2, \text{ and }+e,ovs} \text{ }_{I1}$+ee and $\bar{I}_2$ represent the normalized measured currents of $I_1$ and $I_2$, respectively.

20. The transformer protection unit recited in claim 18, wherein $$I_1 = \begin{bmatrix} I_{1a} \\ I_{1b} \\ I_{1c} \end{bmatrix}, I_2 = \begin{bmatrix} I_{2a} \\ I_{2b} \\ I_{2c} \end{bmatrix}, U =$$

$$\frac{1}{3}\begin{bmatrix} 2 & -1 & -1 \\ -1 & 2 & -1 \\ -1 & -1 & 2 \end{bmatrix}, \text{ and } J = \frac{1}{\sqrt{3}}\begin{bmatrix} 0 & -1 & 1 \\ 1 & 0 & -1 \\ -1 & 1 & 0 \end{bmatrix},$$

where $I_{1a}$, $I_{1b}$, and $I_{1c}$ are the measured currents through the primary windings and $I_{2a}$, $I_{2b}$, and $I_{2c}$ are the measured currents through the secondary windings, for each of the three phases designated a, b, and c, respectively.

21. The transformer protection unit recited in claim 20, wherein the first plurality of current sensors comprises three current transformers, one connected to each of the three primary windings of the transformer, and the second plurality of current sensors comprises another three current transformers, one connected to each of the three secondary windings of the transformer.

22. The transformer protection unit recited in claim 21, further comprising a plurality of analog-to-digital converters for digitalizing the measures of current obtained by the respective current transformers prior to being input to the processor.

23. The transformer protection unit recited in claim 19, further comprising a phase angle measurement device connected to at least one of the primary windings and to at least one of the secondary windings that obtains a measure of the phase angle, P, between the currents through the primary and secondary windings, the processor calculating the normalized measured currents $\overline{I_1}$ and $\overline{I_2}$ based on the measured phase angle, P.

24. The transformer protection unit recited in claim 23, wherein the phase angle measurement device continuously measures the phase angle P, and wherein the processor continuously recalculates the normalized measured currents $\overline{I_1}$ and $\overline{I_2}$ based on the measured phase shift P.

25. A computer-readable medium having program code stored thereon for use in measuring the differential current between a first terminal of a device in a three-phase power system and a second terminal of the device, wherein the device introduces a phase shift between said first and second terminals on each phase of the power system, the program code, when executed by a processor, causing the processor to:

receive, for each phase, a measure of the current through the first terminal of the device and a measure of the current through the second terminal of the device;

normalize the measured currents of each phase of the first and second terminals in order to compensate for changes in at least one of phase and magnitude introduced by the device, said normalization being performed in accordance with the following transformation:

$$G(\theta) = \cos(\theta) U + \sin(\theta) J$$

where G( ) is a generalized normalization transform comprising a quadrature combination of U and J, U represents a unit zero degree phase shift with zero sequence components removed, and J represents a unit ninety degree phase shift with zero sequence components removed; and calculate from the normalized measured currents a differential current for each phase.

26. The computer-readable medium recited in claim 25, wherein said normalization of the measured currents at the first terminal ($I_1$) and at the second terminal ($I_2$) is performed by calculating the following:

$$\overline{I}_1 = G(0) I_1 = \cos(0) U I_1 + \sin(0) J I_1, \text{ and}$$

$$\overline{I}_2 = G(P) I_2 = \cos(P) U I_2 + \sin(P) J I_2$$

where P represents the phase angle by which the phase of $I_1$ lags the phase of $I_2$, and $\overline{I}_1$ and $\overline{I}_2$ represent the normalized measured currents of $I_1$ and $I_2$, respectively.

27. The computer-readable medium recited in claim 25, wherein $$I_1 = \begin{bmatrix} I_{1a} \\ I_{1b} \\ I_{1c} \end{bmatrix}, I_2 = \begin{bmatrix} I_{2a} \\ I_{2b} \\ I_{2c} \end{bmatrix}, U =$$

$$\frac{1}{3}\begin{bmatrix} 2 & -1 & -1 \\ -1 & 2 & -1 \\ -1 & -1 & 2 \end{bmatrix}, \text{ and } J = \frac{1}{\sqrt{3}}\begin{bmatrix} 0 & -1 & 1 \\ 1 & 0 & -1 \\ -1 & 1 & 0 \end{bmatrix},$$

where $I_{1a}$, $I_{1b}$, and $I_{1c}$ are the measured currents through the first terminal and $I_{2a}$, $I_{2b}$, and $I_{2c}$ are the measured currents through the second terminal, for each of the three phases designated a, b, and c, respectively.

28. The computer-readable medium recited in claim 26, wherein said program code further causes the processor to:

receive a measure of the phase angle, P, between measured currents at the first and second terminals; and recalculate the normalized measured currents $\overline{I}_1$ and $\overline{I}_2$ based on the received measure of the phase angle, P.

29. The computer-readable medium recited in claim 26, wherein said program code further causes the computer to:

periodically receive a measure of the phase angle, P, between the measured currents at the first and second terminals; and recalculate the normalized measured currents $\overline{I}_1$ and $\overline{I}_2$ each time a new measure of the phase shift, P, is received.

* * * * *

UNITED STATES PATENT AND TRADEMARK OFFICE
CERTIFICATE OF CORRECTION

PATENT NO.   : 6,507,184 B1
DATED        : January 14, 2003
INVENTOR(S)  : Joel A.B. Elston It is certified that error appears in the above-identified patent and that said Letters Patent is hereby corrected as shown below:

Column 2,
Line 55, "$I_{OPc=+e,ovs1c+ee} - \bar{I}_{2c}$ should read
-- $I_{OPc} = \bar{I}_{1c} - \bar{I}_{2c}$ --

Column 9,
Line 18, "the differential current" should read -- a differential current --;
Lines 24 and 26, "the current" should read -- a current --

Column 10,
Lines 6 and 9, "the current" should read -- a current --.
Lines 14 and 66, "the differential current" should read -- a differential current --;
Lines 20 and 22, "the current" should read -- a current --

Column 11,
Line 30, the first sensor and 12 represents" should read
-- the first sensor and $I_2$ represents --
Line 40, "recited in claim 1" should read -- recited in claim 11 --.

Column 12,
Line 58, "and $_{+e,ovs\,I1}$ + ee and $\bar{I}_2$" should read
-- and $\bar{I}_1$ and $\bar{I}_2$
Lines 22 and 26, "the current" should read -- a current --;

UNITED STATES PATENT AND TRADEMARK OFFICE
CERTIFICATE OF CORRECTION

PATENT NO. : 6,507,184 B1
DATED : January 14, 2003
INVENTOR(S) : Joel A.B. Elston It is certified that error appears in the above-identified patent and that said Letters Patent is hereby corrected as shown below:

<u>Column 13,</u>
Line 2, "the differential current" should read -- a differential current --;
Lines 44 and 45, "the current" should read -- a current --.

Signed and Sealed this

Twentieth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,507,184 B1
DATED : January 14, 2003
INVENTOR(S) : Joel A.B. Elston It is certified that error appears in the above-identified patent and that said Letters Patent is hereby corrected as shown below:

<u>Column 2,</u>
Line 55, "$I_{OPc=+e,ovs1c+ee} - \bar{I}_{2c}$ should read
-- $I_{OPc} = \bar{I}_{1c} - \bar{I}_{2c}$ --

<u>Column 9,</u>
Line 18, "the differential current" should read -- a differential current --;
Lines 24 and 26, "the current" should read -- a current --

<u>Column 10,</u>
Lines 14 and 66, "the differential current" should read -- a differential current --;
Lines 20 and 22, "the current" should read -- a current --

<u>Column 11,</u>
Lines 6 and 9, "the current" should read -- a current --.
Line 30, the first sensor and 12 represents" should read
-- the first sensor and $I_2$ represents --
Line 40, "recited in claim 1" should read -- recited in claim 11 --.

<u>Column 12,</u>
Line 58, "and $_{+e,ovs\,I1}$ + ee and $\bar{I}_2$" should read
-- and $\bar{I}_1$ and $\bar{I}_2$
Lines 22 and 26, "the current" should read -- a current --;

UNITED STATES PATENT AND TRADEMARK OFFICE
CERTIFICATE OF CORRECTION

PATENT NO.    : 6,507,184 B1
DATED         : January 14, 2003
INVENTOR(S)   : Joel A.B. Elston It is certified that error appears in the above-identified patent and that said Letters Patent is hereby corrected as shown below:

<u>Column 13,</u>
Line 37, "the differential current" should read -- a differential current --;
Lines 44 and 45, "the current" should read -- a current --.

This certificate supersedes Certificate of Correction issued May 20, 2003.

Signed and Sealed this

Thirtieth Day of September, 2003

JAMES E. ROGAN
*Director of the United States Patent and Trademark Office*